(12) United States Patent
Gehres

(10) Patent No.: US 7,067,366 B2
(45) Date of Patent: Jun. 27, 2006

(54) METHOD OF MAKING FIELD EFFECT TRANSISTORS HAVING SELF-ALIGNED SOURCE AND DRAIN REGIONS USING INDEPENDENTLY CONTROLLED SPACER WIDTHS

(75) Inventor: Rainer E. Gehres, Wallkill, NY (US)

(73) Assignee: International Business Machines Corporation, Armonk, NY (US)

( * ) Notice: Subject to any disclaimer, the term of this patent is extended or adjusted under 35 U.S.C. 154(b) by 89 days.

(21) Appl. No.: 10/707,725

(22) Filed: Jan. 7, 2004

(65) Prior Publication Data

US 2005/0145942 A1    Jul. 7, 2005

(51) Int. Cl.
*H01L 21/8238* (2006.01)
*H01L 21/336* (2006.01)

(52) U.S. Cl. .................. 438/199; 438/230; 438/303
(58) Field of Classification Search ................ 438/199, 438/305, 301, 307, 576, 765, 558, 303, 230; 257/408
See application file for complete search history.

(56) References Cited

U.S. PATENT DOCUMENTS

| | | | |
|---|---|---|---|
| 6,316,302 B1 * | 11/2001 | Cheek et al. | 438/199 |
| 6,855,988 B1 * | 2/2005 | Madurawe | 257/347 |
| 6,908,822 B1 * | 6/2005 | Rendon et al. | 438/303 |
| 2002/0197806 A1 * | 12/2002 | Furukawa et al. | 438/305 |

* cited by examiner

*Primary Examiner*—Walter L. Lindsay, Jr.
(74) *Attorney, Agent, or Firm*—Daryl K. Neff; H. Daniel Schnurmann

(57) ABSTRACT

A method is provided for defining spacings between the gates of field effect transistors (FETs) of an integrated circuit and the source and drain regions thereof, the spacings differing in width between a first FET and a second FET. The method includes forming gate stacks of the integrated circuit over a substrate, and forming first spacers on sidewalls of the gate stacks. Second spacers are then formed over the first spacers. Thereafter, source and drain regions of the first FET are formed in alignment with the second spacers of a first gate stack of the gate stacks. The second spacers are then removed from the first spacers of the gate stacks. Thereafter, the first spacers of a second gate stack are anisotropically etched in a substantially vertical direction to remove horizontally extending portions of the first spacers, and source and drain regions of the second FET are formed in alignment with portions of the first spacers of the first gate stack which remain after the etching.

14 Claims, 12 Drawing Sheets

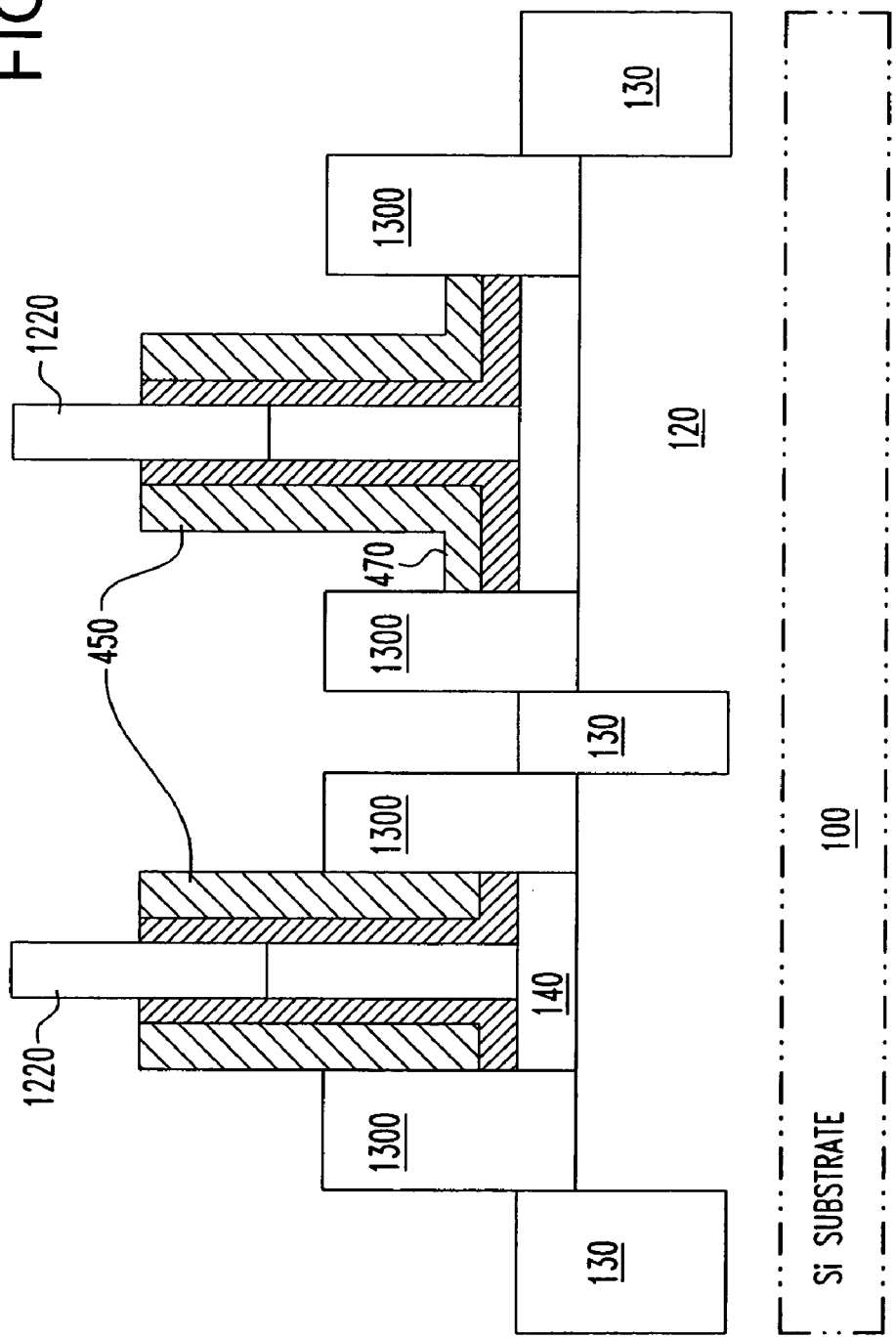

METHOD OF MAKING FIELD EFFECT TRANSISTORS HAVING SELF-ALIGNED SOURCE AND DRAIN REGIONS USING INDEPENDENTLY CONTROLLED SPACER WIDTHS

BACKGROUND OF INVENTION

The invention relates to semiconductor manufacturing processes, and more particularly to a method of making field effect transistors having source and drain regions self-aligned to the gates thereof.

In fabrication of complementary metal oxide semiconductor (CMOS) integrated circuits, gate sidewall spacers are sometimes used to control the spacing between the source and drain regions of field effect transistors (FETs) and the gates of the FETs. Typically in such process, source and drain doping is performed by ion implantation into a semiconductor substrate, using the gate stack and one or more spacers formed on sidewalls of the gate stack as a mask.

Many integrated circuits ("ICs" or "chips") include both n-type FETs (NFETs) and p-type FETs (PFETs), such as integrated circuits having complementary metal oxide semiconductor (CMOS) technology, but non-CMOS technology chips such as NMOS chips often incorporate PFETs as well. For best performance, it is sometimes desirable or necessary for the source and drain regions of a PFET to be spaced a different distance from the gate of the PFET than is the case for an NFET on the same chip. The source and drain regions may either be spaced farther away from the gate in the PFET than in the NFET or, alternatively, closer to the gate.

In a particular instance, it is desirable to space the source and drain regions farther away from the channel in the PFET than in the NFET (and hence farther from the gate of the PFET) because of a silicide which is provided on the source and drain regions of the PFET and NFET. When particular types of silicide are used such as $CoSi_2$, the silicide has a tendency during processing of the chip to draw the dopant boron out of the PFET by migration. Boron is drawn from the source and drain regions of the PFET where it is the primary dopant, and in turn, from the channel region where it is also generally provided for other purposes such as for threshold adjustment. As a result, the boron concentration at locations in the channel region of the PFET can fall below a desirable level. To reduce this effect to a tolerable level, the source and drain regions of the PFET should be located at a sufficient distance from the channel. Therefore, the gate sidewall spacer or spacers used to self-align the source and drain regions in the PFET to the channel should be relatively thick.

However, if spacers of the same thickness are used to self-align the source and drain regions in the NFET, less than desirable performance results. Since the problem of boron migration is not suffered by the NFET, the gate sidewall spacer need not be as thick. Better performance is achieved when the source and drain regions of the NFET are spaced more closely to the channel of the NFET, hence the need to use a thinner gate sidewall spacer in the NFET.

It is further desirable to form both NFETs and PFETs of the chip by an integrated process in which most steps are common to both types of transistors and only a few steps are performed separately to the NFETs and the PFETs. With reference to FIG. 1A, in a technique which is background to the present invention but which is not admitted to be prior art, a gate sidewall spacer or set of spacers are patterned by wet etch processing to have different widths in respective areas where NFETs and PFETs are formed.

FIG. 1A is a top down view of a PFET 14 and an NFET 12 which share a common gate conductor 10. The PFET 14 is formed over a first active area 40 which is surrounded by an isolation 30 such as a trench isolation. The PFET has source and drain regions 50 which are spaced a distance 55 from the gate conductor 10 by a spacer or set of spacers shown at 70, hereinafter referred to as "spacer" 70. The NFET 12 is formed over a second active area 42 which is also surrounded by an isolation 30 such as a shallow trench isolation (STI). The NFET 12 has source and drain regions 60 which are spaced a distance 57 from the gate conductor 10 by a spacer or set of spacers shown at 72, hereinafter referred to as "spacer" 72.

According to the background technique, a masking layer such as patterned photoresist layer 80 is formed covering the active area 40 where the PFET 14 will be formed while exposing the area where the NFET 12 will be formed. Wet etching is then performed such that the spacer 72 is made thinner for the NFET 12 than the spacer 70 as exists in the PFET area 14.

A problem of this background technique is that the wet etch process used to pattern the gate sidewall spacer is not very precise. Wet etching is usually isotropic or substantially isotropic in character, such that it tends to proceed uniformly in different directions. Because of this, wet etching tends to undercut material under a masking layer. However, such effect reduces over the distance from the edge of the masking layer 80. As a result, a tapered region 75 results in which the spacer has width between that of spacer 70 and spacer 72 in the respective PFET and NFET regions. A disadvantage of the spacers 70, 72 having a tapered region 75 between them is reduced process window. As shown in FIG. 1A, the distance 52 between the edge of the NFET active area 42 and the tapered region 75 is rather small. This small distance 52 represents the overlay tolerance between the various lithographic processes used to define the locations of the active areas and the masking layer 80, among others. As is well understood, small overlay tolerance can lead to problems in manufacturing yields. While one way to increase the overlay tolerance would be to increase the distance between the active areas 40 and 42, such would be undesirable as it would lead to a less compact circuit and longer gate conductor patterns having an increased RC (resistance-capacitance) time constant.

Therefore, it would be desirable to provide a process for defining the widths of gate sidewall spacers of respective FETs of an integrated circuit which provides increased overlay tolerance.

SUMMARY OF INVENTION

According to an aspect of the invention, a method is provided for defining spacings between the gates of field effect transistors (FETs) of an integrated circuit and the source and drain regions thereof, the spacings differing in width between a first FET and a second FET. The method includes forming gate stacks of the integrated circuit over a substrate, and forming first spacers on sidewalls of the gate stacks. Second spacers are then formed over the first spacers. Thereafter, source and drain regions of the first FET are formed in alignment with the second spacers of a first gate stack of the gate stacks. The second spacers are then removed from the first spacers of the gate stacks. Thereafter, the first spacers of a second gate stack are anisotropically etched in a substantially vertical direction to remove horizontally extending portions of the first spacers, and source and drain regions of the second FET are formed in alignment with portions of the first spacers of the first gate stack which remain after the etching.

BRIEF DESCRIPTION OF DRAWINGS

FIGS. 2 through 12 illustrate stages in processing according to embodiments of the invention.

DETAILED DESCRIPTION

Accordingly, a method is provided according to the present invention in which the widths of gate sidewall spacers are made different for respective FETs of the chip. Improved process window is provided by virtue of using a vertical etch process to define the areas in which the respective FETs are formed.

Figure 1B:
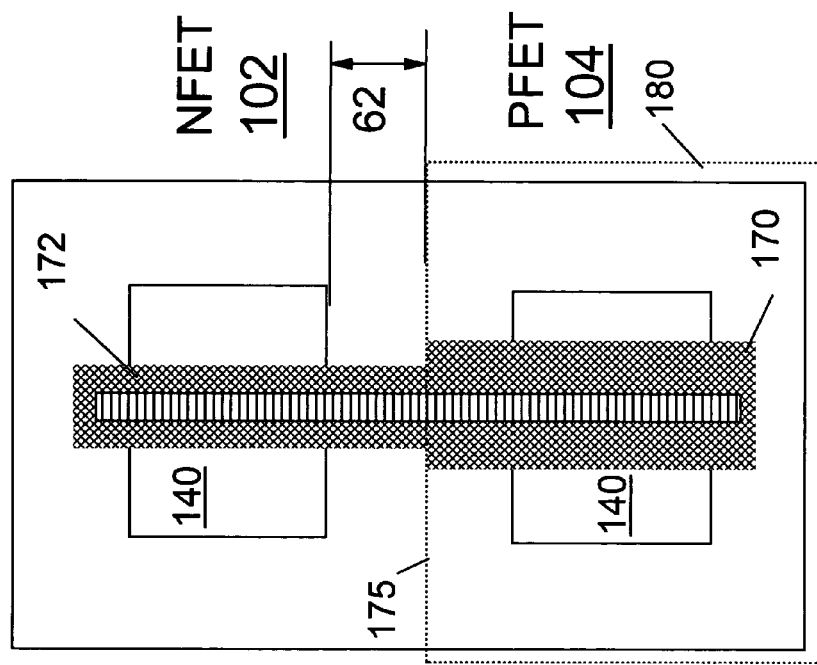
FIG. 1B is a top down view illustrating processing to define gate sidewall spacers having different widths in particular FETs according to an embodiment of the invention.

In an embodiment of the invention shown in FIG. 1B, an NFET 102 and a PFET 104 are provided in active areas 140 of a single-crystal semiconductor region of a substrate. The substrate is preferably a semiconductor-on-insulator substrate such as a silicon-on-insulator (SOI) substrate, although, a bulk semiconductor substrate can be alternatively used. When field effect transistors (FETs) are formed in SOI substrates, faster switching operation is often achieved than otherwise, because junction capacitance between the channel region of the transistor and the bulk substrate is eliminated.

Figure 1A:
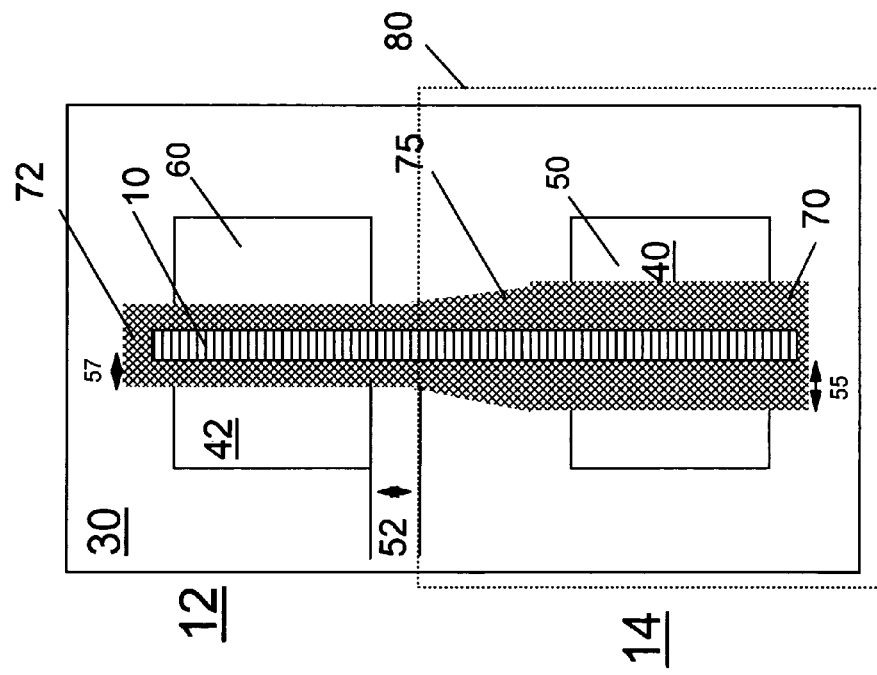
FIG. 1A is a top down view illustrating processing to define gate sidewall spacers having different widths in particular FETs according to a method which is background to the present invention.

The embodiment shown in FIG. 1B is similar to that shown in FIG. 1A, with the exception that the boundary between the thin spacer 172 in the NFET 102 and the thicker spacer 170 in the PFET 104 is more sharply defined, by the boundary 175 of a masking layer 180. Compared to the background process described in FIG. 1A in which a small overlay tolerance 52 is provided, a larger overlay tolerance 62 results from this process.

Figure 2:
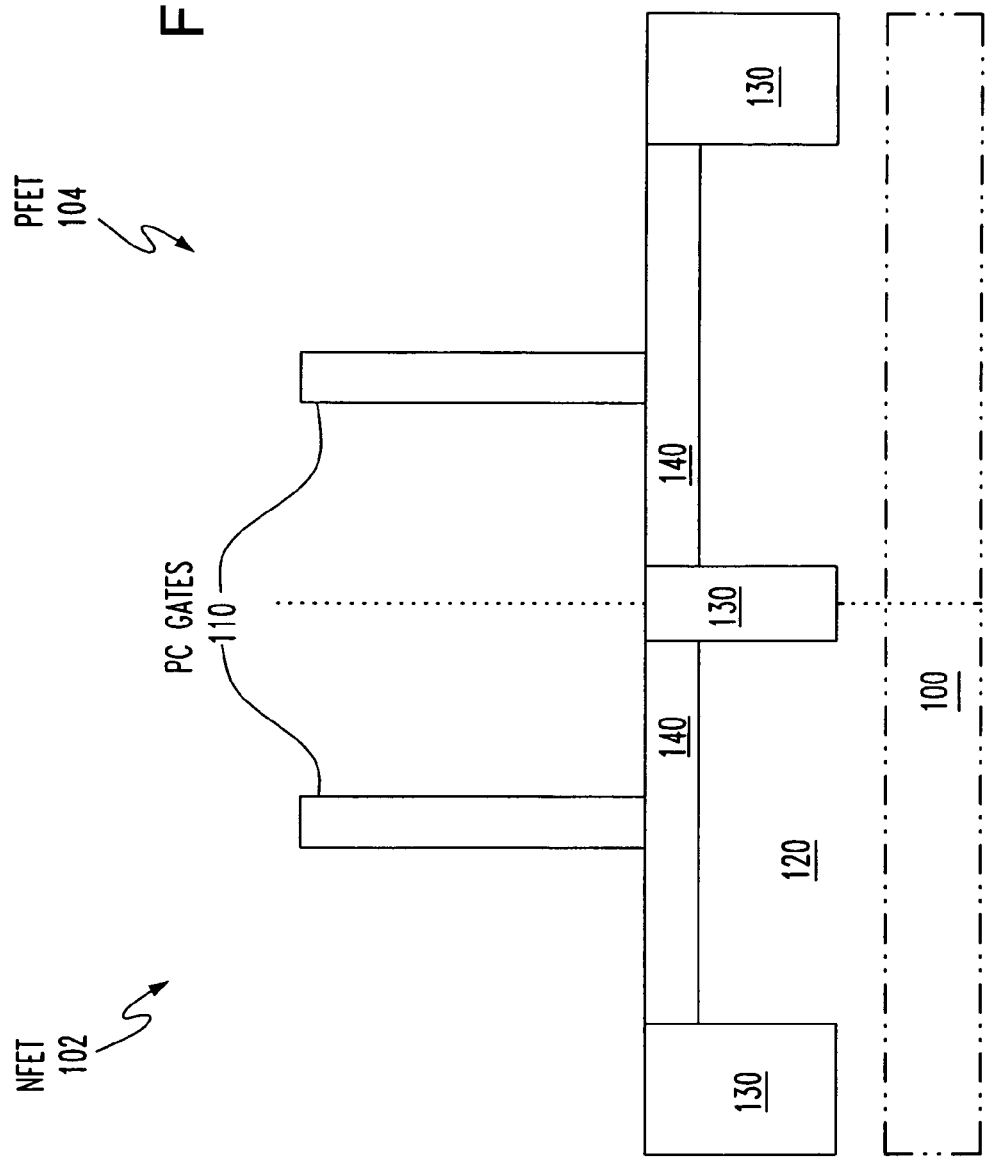

FIGS. 2 through 12 illustrate stages of processing according to an embodiment of the invention. FIG. 2 is a cross sectional view of an initial stage of processing according to such embodiment. In contrast to FIG. 1B in which the NFET 102 and the PFET 104 are shown as aligned end-to-end, the NFET 102 and the PFET 104 are shown side by side in FIGS. 2–13 for ease of description, with the understanding that the views shown in each FIG. are representative of either such placement.

As shown in FIG. 2, processing is begun on an SOI substrate in which active areas 140 are formed in a relatively thin single-crystal semiconductor region formed over a bulk portion 100 of a silicon substrate 100, separated therefrom by an insulating layer 120. In a preferred embodiment as depicted in FIG. 2, the insulating layer is a layer of buried oxide (BOX) 120, formed below the surface of the bulk silicon wafer 100, such as by a separation by ion implanted oxide (SIMOX) process. Alternatively, a bulk semiconductor wafer may be used instead of an SOI wafer, the bulk semiconductor wafer not having an insulating layer 120.

Active areas 140 will ultimately house independent active devices. To assure device and operational integrity, adjacent active areas are preferably electrically isolated using isolation structures. In a preferred embodiment as depicted in FIG. 2, shallow trench isolation (STI) structures 130 separate and electrically isolate the adjacent active areas. In FIG. 2, two active areas 140 are depicted in respective areas 102 and 104 which will ultimately house an NFET and a PFET, respectively. Hereinafter, reference numbers 102 and 104 refer to those areas, whether or not the NFET and PFET are fully formed. As further shown in FIG. 2, two polysilicon conductor or "polyconductor" (PC) gate stacks 110 are provided, each including polysilicon separated from the respective active area 140 by a gate dielectric such as a gate oxide.

Figure 3:
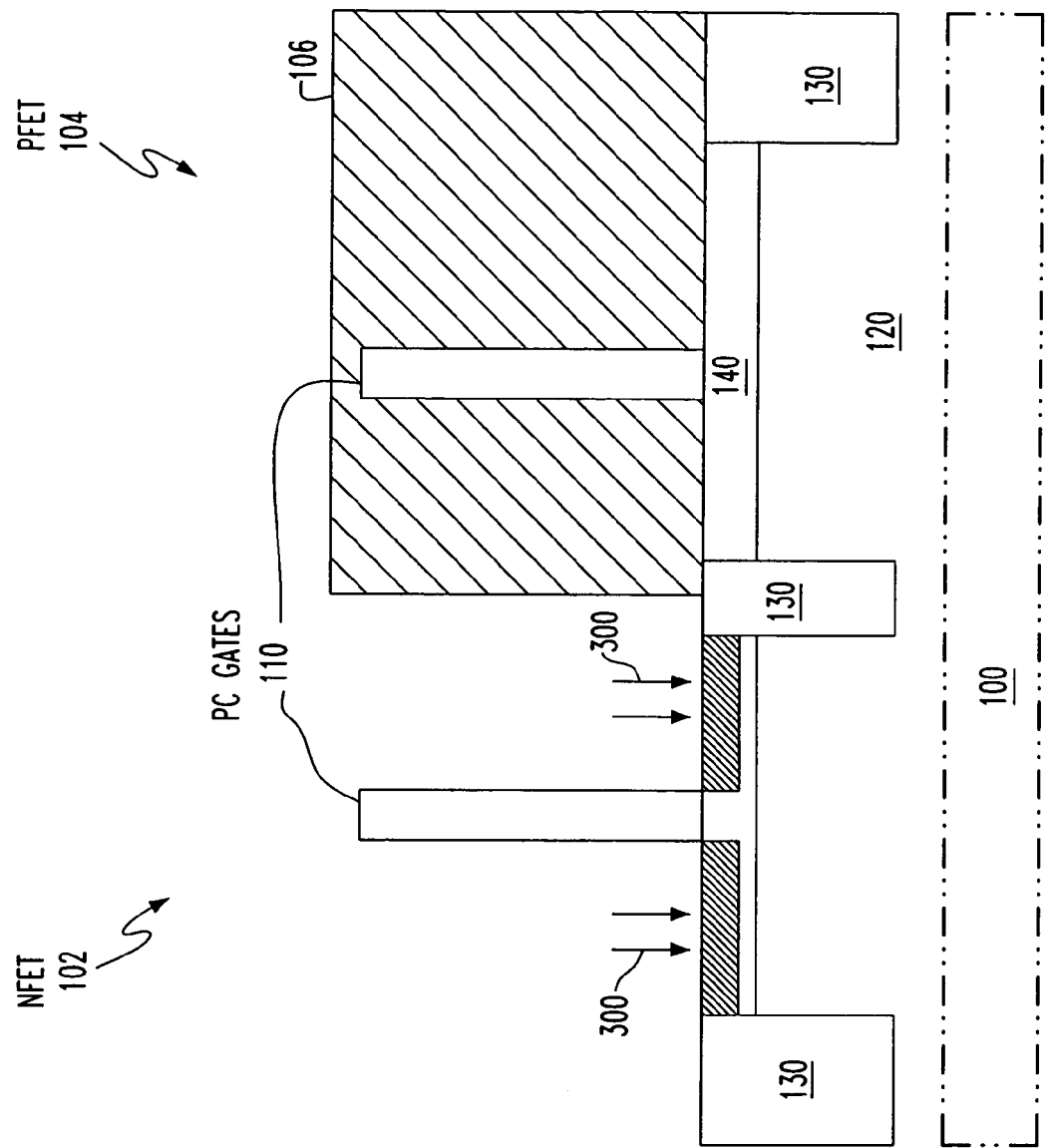

FIG. 3 illustrates a subsequent processing stage. As shown in FIG. 3, lightly doped drain extensions and/or halos are implanted in areas 300 surrounding the PC gate stack in the NFET area 102, while the PFET area 104 is masked, as by a photoresist pattern 106. The implants are performed using the NFET gate stack 110 as a mask to self-align the extensions and/or halos to the channel region below the NFET gate stack 110.

Figure 4:
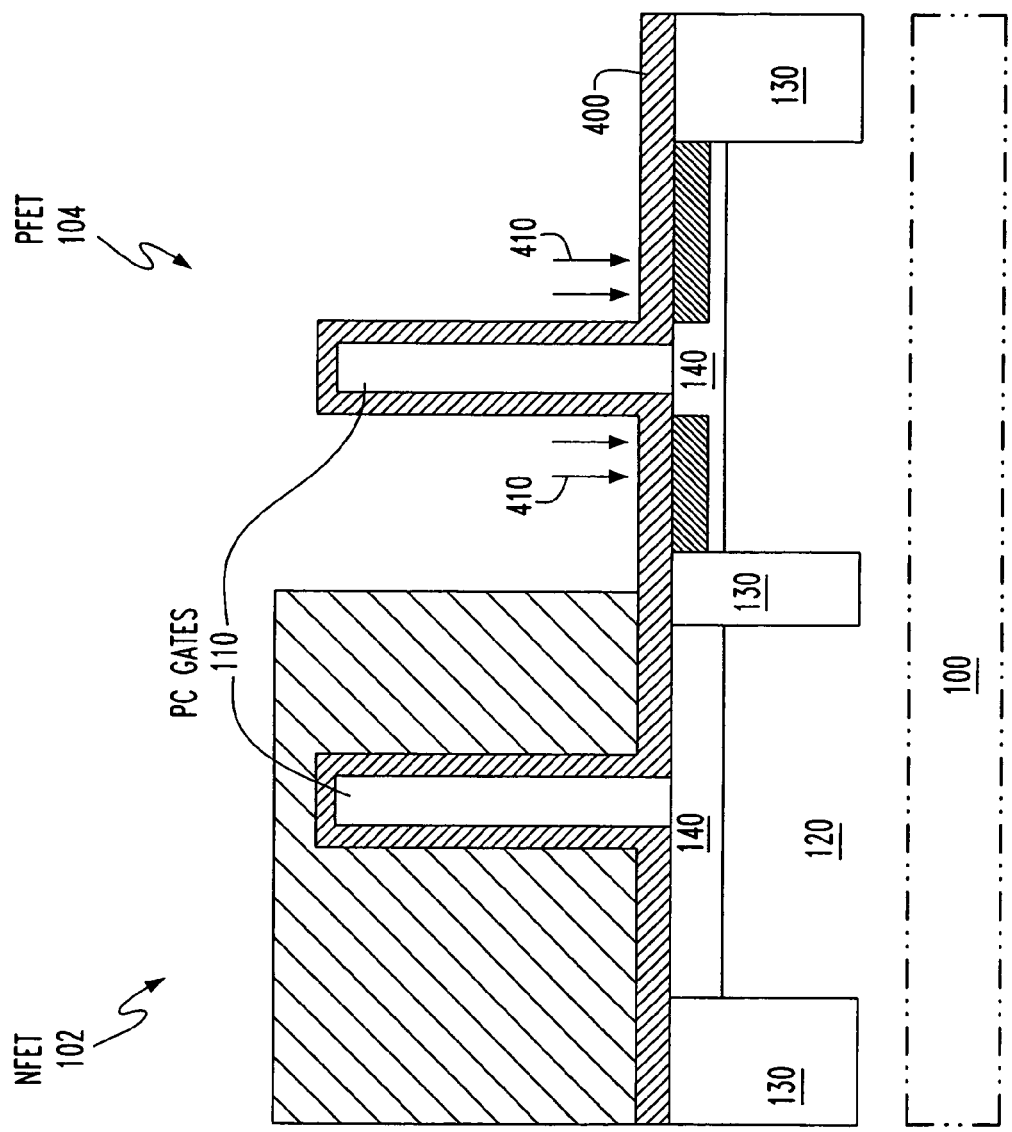

FIG. 4 illustrates a stage in the formation of a multilayered spacer structure. In FIG. 4, a thin layer of oxide 400 is formed on exposed surfaces of the PC stacks 110 and active areas 140. In a preferred embodiment, local thermal oxidation such as by annealing in an oxygen-containing environment, is used to form the oxide layer 400. Alternatively, the oxide layer 400 can be formed by deposition, such as from a TEOS (tetraethylorthosilicate) precursor, or by low pressure chemical vapor deposition (LPCVD).

After forming the oxide layer 400, the NFET area 102 is masked, and lightly doped drain extensions and/or halos are implanted in the PFET area 104, as shown at 410, using the oxide layer 400 and the PC 110 as a mask. As a result, the lightly doped drain extensions and halo regions are spaced a distance farther from the channel of the PFET 104 than they are in the NFET 102, the distance being determined by the thickness of the oxide layer 400.

Figure 5:
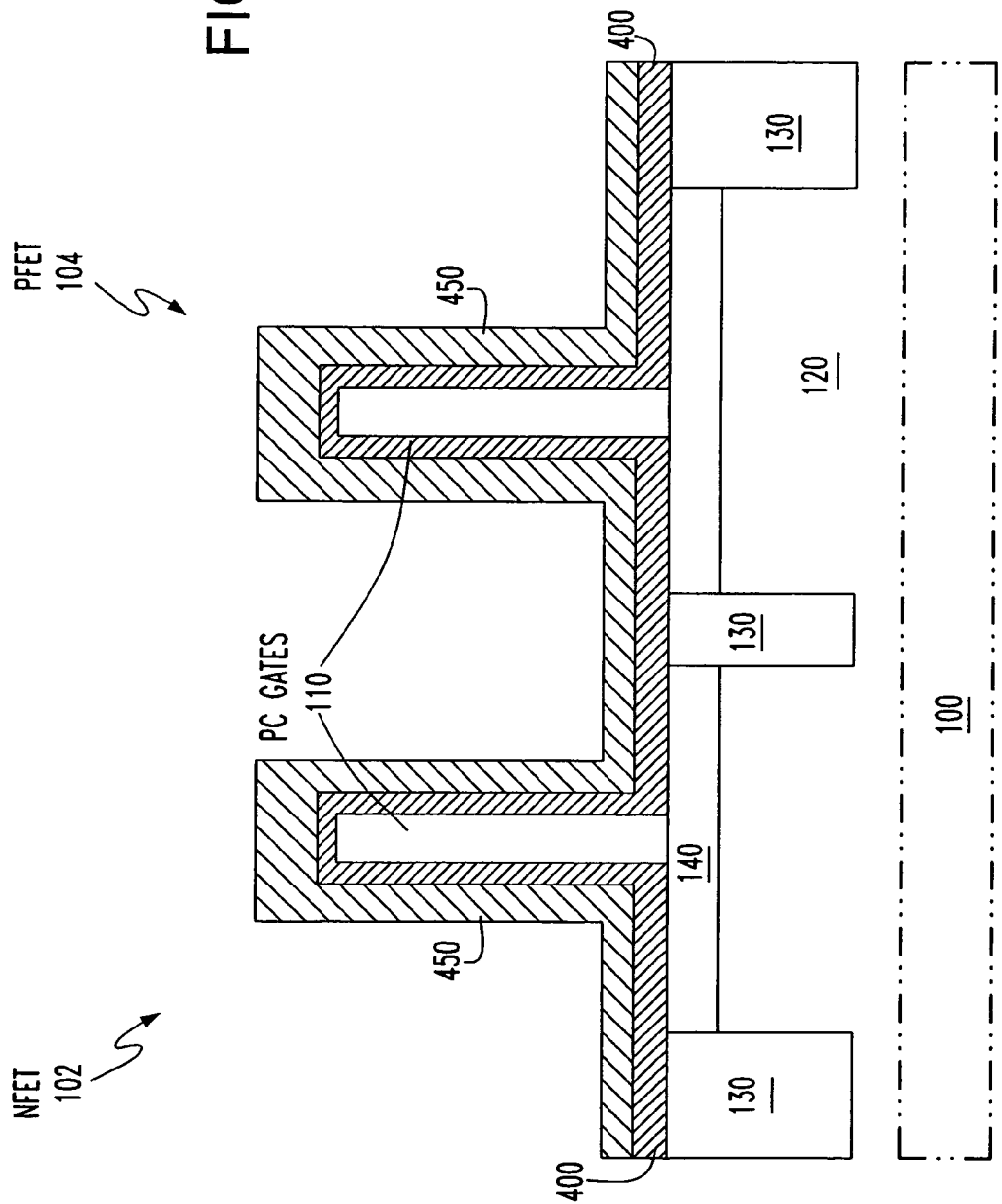
Figure 6:
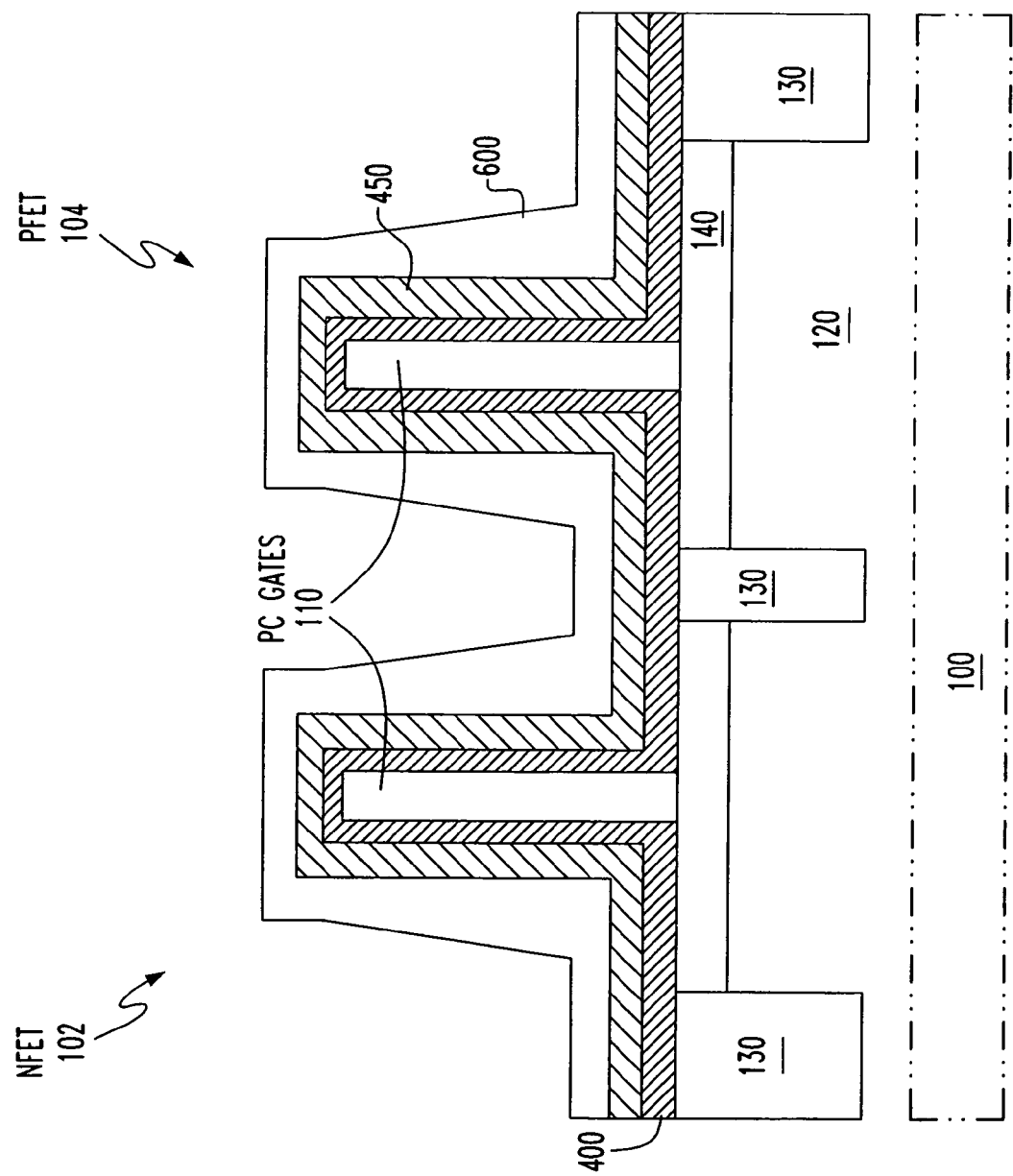

FIG. 5 illustrates deposition of a first spacer layer 450 over the structures provided in areas 102 and 104. The first spacer layer 450 preferably consists essentially of silicon nitride ($Si_3N_4$). As illustrated in FIG. 6, to allow for subsequent patterning of the first spacer layer 450, a second spacer layer 600, preferably consisting essentially of silicon dioxide, is deposited over the first spacer layer 450.

Figure 7:
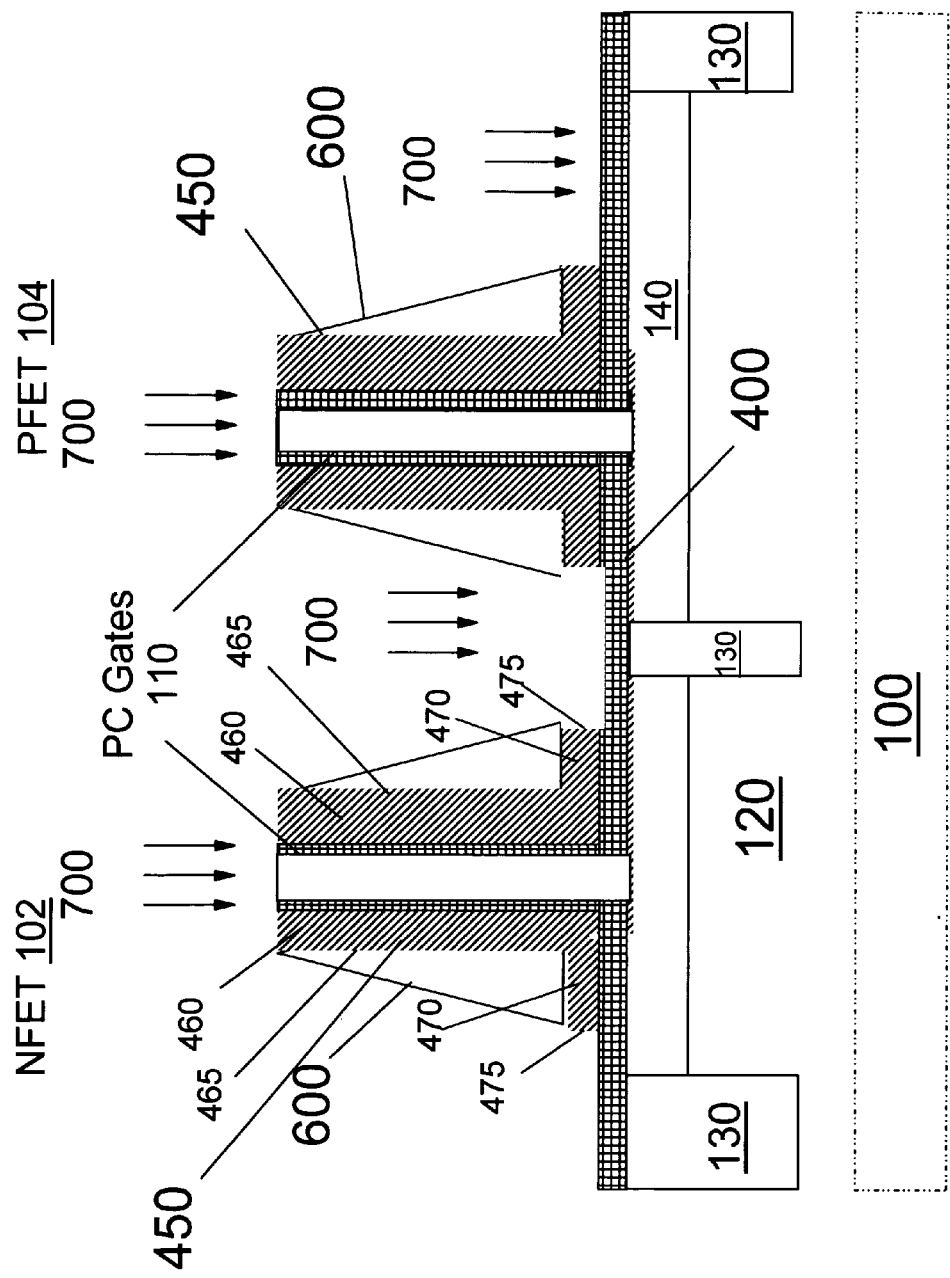

FIG. 7 illustrates a subsequent stage of processing in which the first and second spacer layers 450 and 600 are patterned by a vertical etch process 700 to form first and second spacers, which bear the same reference numbers, respectively. As a result of the vertical etch process, the first spacers 450 exhibit an "L" shape, each having a vertically oriented or "vertical" portion 460 extending in a direction generally parallel to the sidewall of the PC gate stack 110, and a horizontally oriented or "horizontal" portion 470 extending in a direction generally parallel to the surface of the active area 140. The horizontal portions 470 have edges 475 which are horizontally or laterally displaced from the walls 465 of the vertical portions 470 of the first spacers. As can be seen in FIG. 7, the second spacers 600 extend along walls 465 of the vertical portions 460 so as to vertically overlie the horizontal portions 470. As a consequence of the vertical etch process, the second spacers extend to the edges 475 of the first spacers. Preferably, this patterning is performed by a reactive ion etch (RIE) which is not selective to the material of either spacer layer, i.e. not selective to nitride or to oxide. Alternatively, a two-step etch can be performed to first etch the overlying layer 600 selective to nitride, and then etching the first layer 450 selective to oxide. At the conclusion of this etching procedure, the tops of the PC gate stacks 110 become exposed between the first spacers 450 on the sidewalls of the gates.

Figure 8:
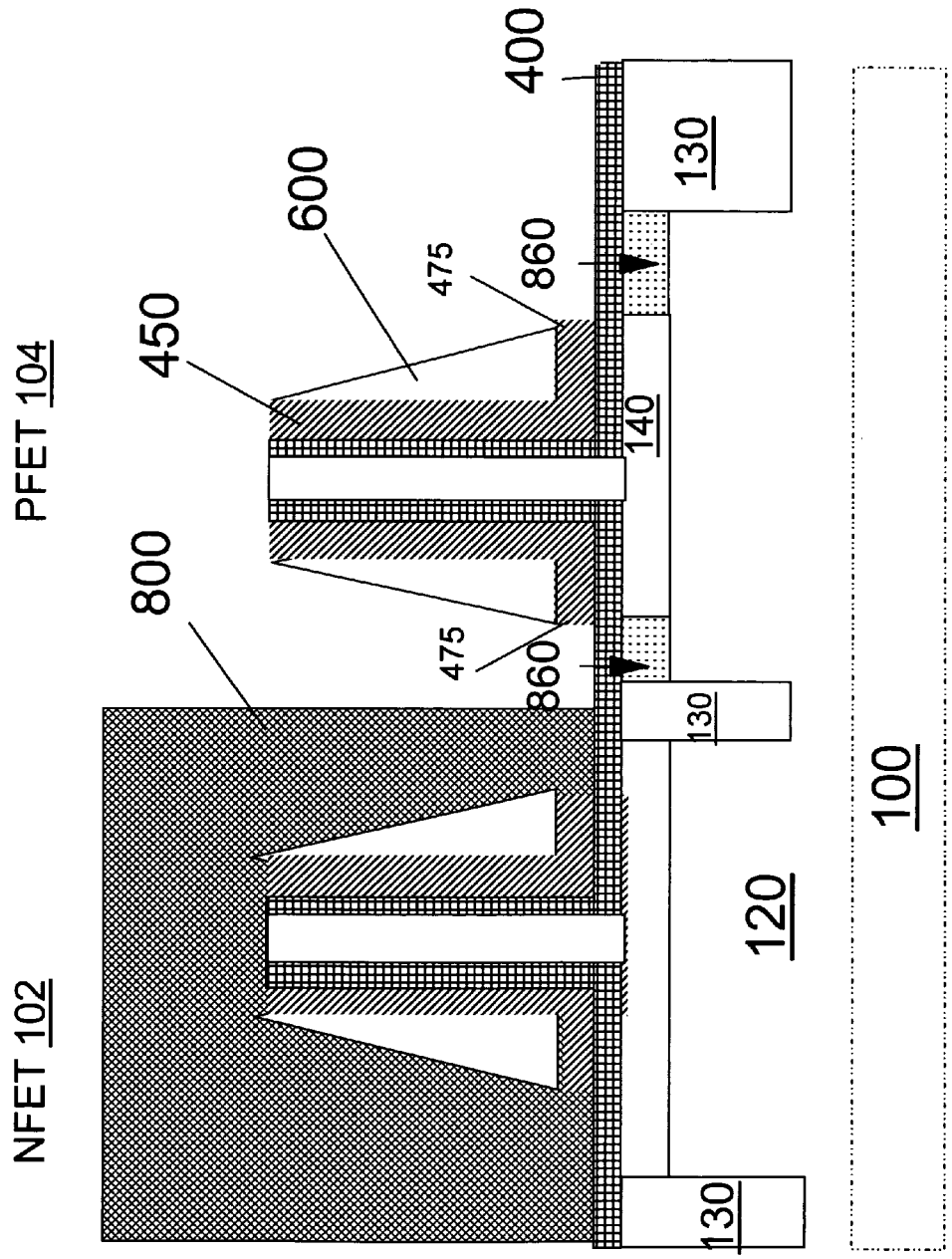

FIG. 8 is a cross sectional depiction of a subsequent processing stage. As shown in FIG. 8, the NFET area 102 is masked, as shown at 800, while source and drain ion implants are performed to the active area 140 of the PFET 104. Once the mask 800 is in place, the source and drain regions in the PEET area 104 are ion implanted with a p-type dopant such as boron. With the presence of the first spacers 450 and second spacers 600, the ion implantation into the active area 140 is aligned with the edges 475 of the first spacers, thus aligning the source and drain regions of the PFET to the edges 475 of the first spacers. The implants in the source and drain regions are depicted by reference number 860. After the completion of the source and drain ion implants for the PFET, the mask 800 is removed and post clean-up procedures are conducted following such removal.

Figure 9:
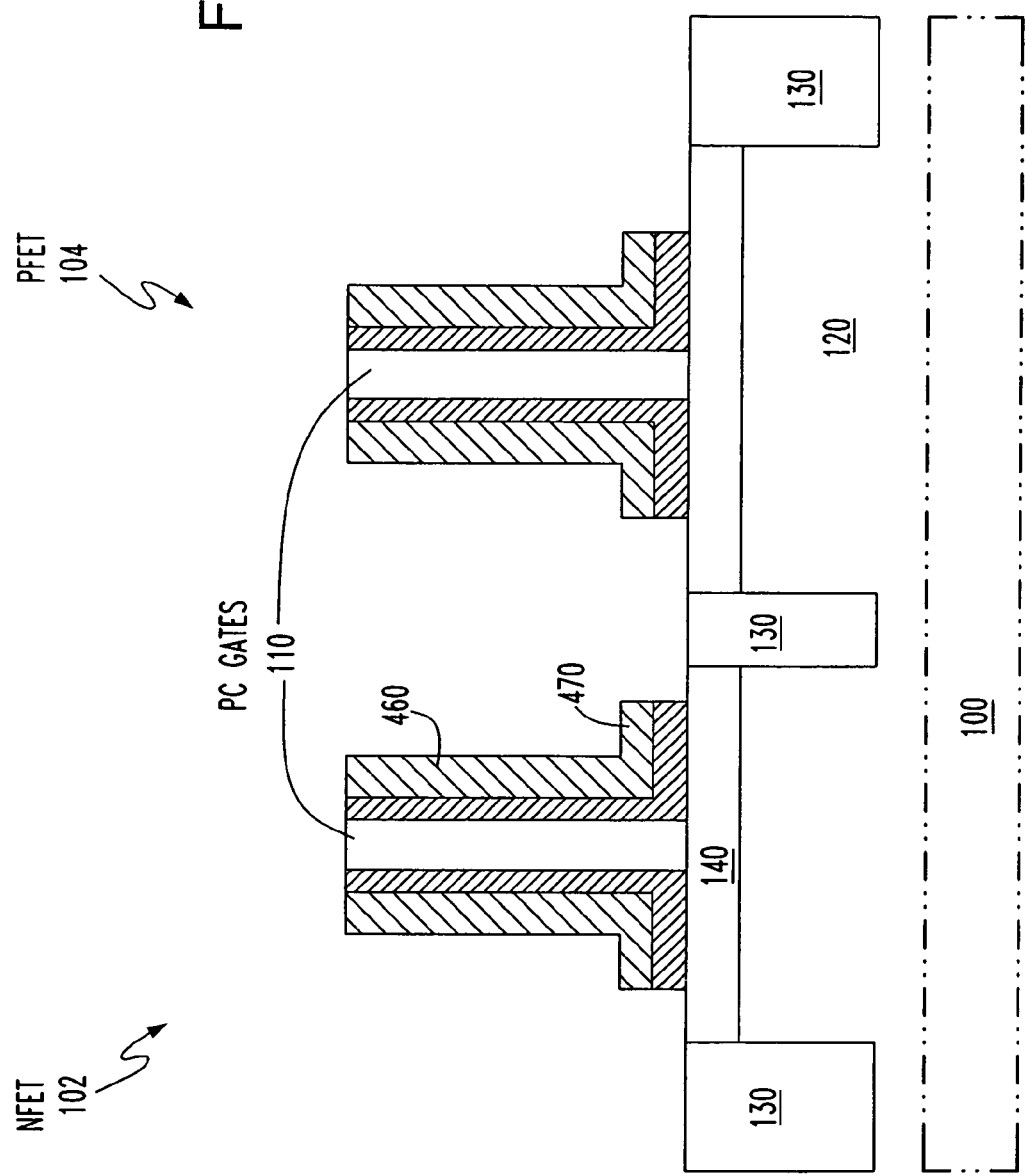

After the source and drain regions are implanted in the PFET 104, processing proceeds to implanting source and drain regions in the NFET 102. As shown in FIG. 9, the second spacers 600 are removed from the structures in areas 102 and 104, as by a blanket wet etch selective to silicon nitride. Such wet etch results in removal of the oxide layer 400 as well, where exposed in areas that do not underlie the first (nitride) spacers 450. At the conclusion of this stage of processing, with the removal of the second spacers 600, the horizontal portions 470 of the first (nitride) spacers are exposed.

Figure 10:
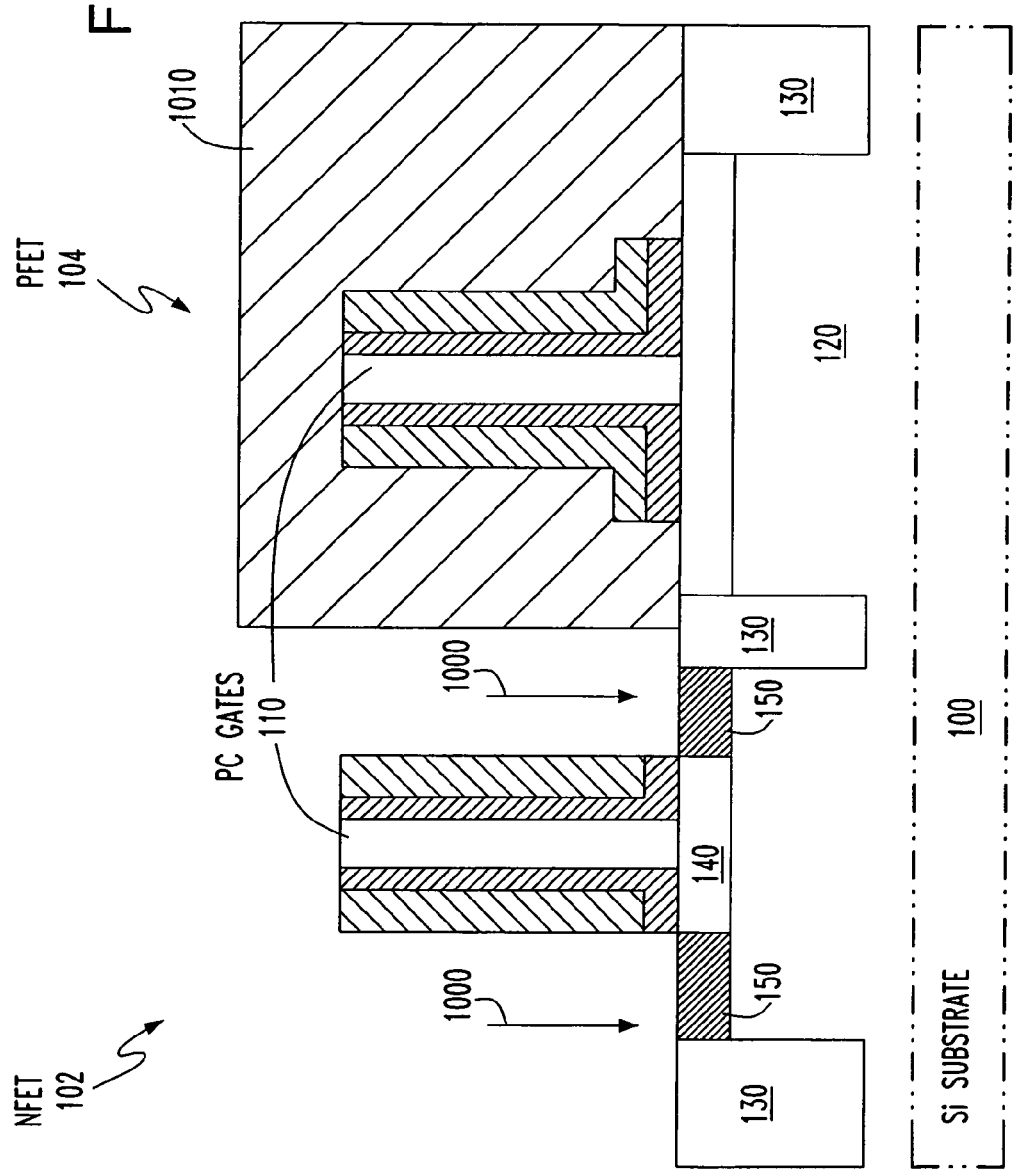
Figure 11:
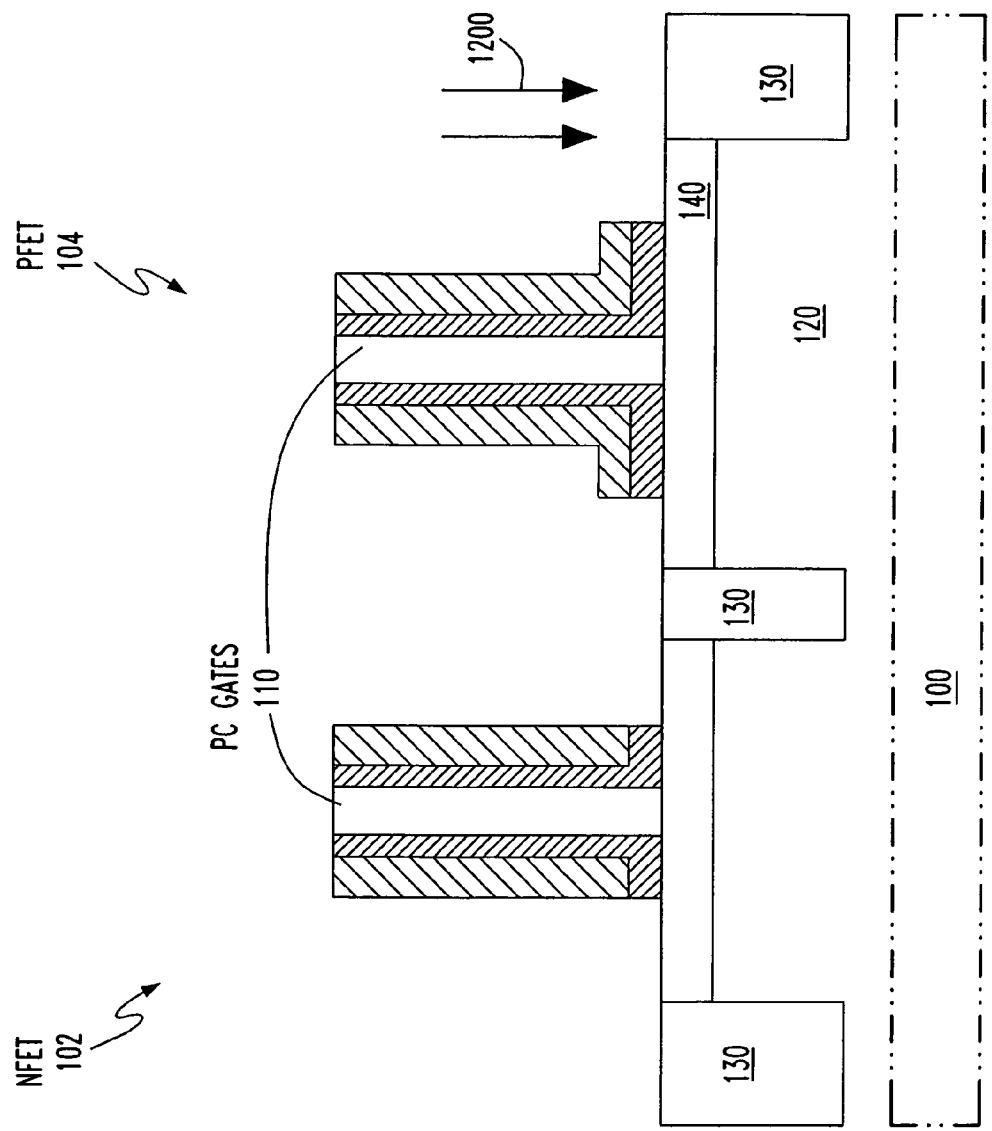

Thereafter, as shown in FIG. 10, a further masking layer 1010 is patterned to cover the PFET area 104 while exposing the NFET area 102. An anisotropic vertical etch 1000 is then conducted to remove the horizontally oriented portions 470 of the spacers. Such etch is preferably performed by a reactive ion etch (RIE). A reactive ion etch produces a more sharply defined boundary between etched areas and non-etched areas. In such manner, the taper region 75 (FIG. 1A) is eliminated between the spacer 450 as formed in the NFET 102 and the spacer 450 which is formed in the PFET 104.

The etching process removes the horizontally oriented portion 470 of the spacer in the NFET area 102 while leaving the vertically oriented portion 460 in place. After such etch, source and drain implants are performed to the NFET area 102 in the same direction as the direction of the prior anisotropic etch 1000, to produce source and drain regions 150 aligned to walls of the vertically oriented portions of the first spacers, the source and drain regions 150 thus being self-aligned to the channel region of the NFET 102. Such implantation is masked by the remaining portion of first spacer 450 and the PC gate 110. The spacing of the source and drain regions 150 are determined by the width of the remaining portion 460 of the spacer.

Thereafter, the masking layer 1010 is removed and post etch and implantation clean-up procedures are preferably conducted. Such procedures preferably include passivation of the surface of the active areas 140, as by a local oxidation and wet etch procedure. This is then preferably followed by an anneal to cure damage resulting from the prior etch and implantation. The post clean-up procedure in this case can be thought of as a pre-clean-up procedure for subsequent processing in which cobalt or other silicide precursor is used to form a self-aligned silicide (salicide) overlying the source and drain regions of the PFET and NFET. The resulting structure after the removal of the masking layer 1010 and post clean-up procedures is illustrated in the cross-sectional view of FIG. 11.

FIG. 12 illustrates a final processing stage in which self-aligned silicide is formed overlying the source and drain regions, and the gates of the NFET 102 and PFET 104. This proceeds preferably by blanket deposition of a silicide precursor material such as cobalt, followed by heat treatment to react the cobalt with the underlying silicon of the source, drain and gates of the NFET and PFET. Any unreacted silicide precursor remaining thereafter, such as which coats the spacers 450, is removed, as by wet etching selective to the silicide material and nitride of the spacers 450.

Many modifications can be made in various alternative embodiments of the invention. For example, it is not essential that the first spacer 450 be formed of silicon nitride and the second spacer 600 be formed of silicon dioxide, so long as the second spacer 600 is removed in a manner which is selective to the underlying first spacer, as described above with reference to FIG. 9. Thus, for example, the first spacer 450 can be formed essentially of an oxide material such as silicon dioxide while the second spacer 600 is then formed of another material such as silicon nitride such that removal of the silicon nitride is performed selective to the underlying silicon dioxide of the first spacer.

Accordingly, the herein described embodiments of the invention provide methods for forming self-aligned source and drain regions of an NFET and a PFET, such that the spacing between the source and drain regions and the gates of the transistors is determined by gate sidewall spacers having widths which are determined differently for the respective FETs. Accordingly, superior device performance can be obtained by spacing the source and drain regions closer to the channel region in the NFET while spacing the source and drain regions farther from the channel region in the PFET. In addition, the methods enable use of a desirable silicide in both NFET and PFET areas. The methods further enhance the process window by more sharply defining areas in which the thicker and thinner gate sidewall spacers are located.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of fabricating first and second field effect transistors (FETs) of an integrated circuit such that said first FET has different spacings between the gate and the source and drain regions thereof than said second FET, comprising:

forming a first gate stack and a second gate stack overlying a main surface of a substrate;

forming first spacers and second spacers on each of said first and second gate stacks, each of said first spacers having an "L" shape, each said first spacer including a vertically extending portion oriented in a vertical direction generally perpendicular to said main surface, and a horizontally extending portion oriented in a horizontal direction parallel to said main surface, said horizontally extending portion having an edge horizontally displaced from a wall of said vertically extending portion, each of said second spacers extending along said walls of said vertically extending portions, said second spacers overlying said horizontally extending portions of said first spacers;

implanting source and drain regions of said first FET aligned to said edges of said horizontally extending portions of said first spacers of said first gate stack;

removing said second spacers and said horizontally extending portions of said first spacers by an anisotropic vertical etch process after forming said source and drain regions of said first FET; and implanting source and drain regions of said second FET in said substrate aligned to said walls of said vertically extending portions of said first spacers of said second gate stack after removing said horizontally extending portions.

2. The method according to claim 1 wherein said first FET is a p-type FET (PFET) and said second FET is an n-type FET (NFET).

3. The method according to claim 2 wherein said gate stacks of said first and second FETs are aligned end-to-end in a horizontal direction over said substrate.

4. The method according to claim 1 wherein said substrate is a silicon-on-insulator substrate having an upper layer including a single-crystal semiconductor.

5. The method according to claim 4 wherein said single-crystal semiconductor consists essentially of silicon.

6. The method according to claim 2 further comprising forming a self-aligned silicide aligned to said source and drain regions of said NFET and said PFET.

7. The method according to claim 6 further comprising forming source and drain extensions of said NFET aligned to said gate stack of said NFET.

8. The method according to claim 7 further comprising forming a thin dielectric on said gate stack of at least said PFET and forming source and drain extensions of said PFET aligned to said thin dielectric.

9. The method according to claim 8 wherein said thin dielectric is formed by local thermal oxidation.

10. The method according to claim 2 wherein said etching is performed by a process including a reactive ion etch.

11. The method according to claim 10 wherein said first spacers consist essentially of silicon nitride and said second spacers consist essentially of silicon dioxide.

12. The method according to claim 10 wherein said first spacers consist essentially of silicon dioxide and said second spacers consist essentially of silicon nitride.

13. The method according to claim 6 wherein said silicide is a silicide of cobalt.

14. The method according to claim 13 further comprising forming a self-aligned suicide aligned to said gate stacks of said NFET and said PFET.

* * * * *